(12) United States Patent
Sasaki

(10) Patent No.: US 10,854,418 B2
(45) Date of Patent: Dec. 1, 2020

(54) ION IMPLANTER AND METHOD OF CONTROLLING ION IMPLANTER

(71) Applicant: SUMITOMO HEAVY INDUSTRIES ION TECHNOLOGY CO., LTD., Tokyo (JP)

(72) Inventor: Haruka Sasaki, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 16/197,523

(22) Filed: Nov. 21, 2018

(65) Prior Publication Data

US 2019/0157035 A1 May 23, 2019

(30) Foreign Application Priority Data

Nov. 22, 2017 (JP) .................. 2017-225034

(51) Int. Cl.
*H01J 37/05* (2006.01)
*H01J 37/317* (2006.01)
*H01J 37/147* (2006.01)
*H01J 37/08* (2006.01)
(Continued)

(52) U.S. Cl.
CPC ............. *H01J 37/05* (2013.01); *H01J 37/08* (2013.01); *H01J 37/141* (2013.01); *H01J 37/147* (2013.01); *H01J 37/3171* (2013.01); H01J 49/30 (2013.01); H01J 2237/0473 (2013.01); H01J 2237/055 (2013.01); H01J 2237/057 (2013.01)

(58) Field of Classification Search
CPC ........ H01J 37/05; H01J 37/141; H01J 37/147; H01J 37/3171; H01J 2237/057; H01J 49/30
See application file for complete search history.

(56) References Cited

U.S. PATENT DOCUMENTS

| 5,751,002 A | 5/1998 | Ogata et al. |
| 2002/0066872 A1* | 6/2002 | Nishihashi .......... H01J 37/3171 250/492.21 |

(Continued)

FOREIGN PATENT DOCUMENTS

| JP | H03-201356 A | 9/1991 |
| JP | H07-325200 A | 12/1995 |

(Continued)

*Primary Examiner* — Wyatt A Stoffa
(74) *Attorney, Agent, or Firm* — Michael Best & Friedrich LLP

(57) ABSTRACT

A mass analyzer includes a mass analyzing magnet that applies a magnetic field to ions extracted from an ion source to deflect the ions, a mass analyzing slit that is provided downstream of the mass analyzing magnet and allows an ion of a desired ion species among the deflected ions to selectively pass, and a lens device that is provided between the mass analyzing magnet and the mass analyzing slit and applies a magnetic field and/or an electric field to the ion beam to adjust the convergence or divergence of a ion beam. The mass analyzer changes a focal point of the ion beam in a predetermined adjustable range between an upstream side and a downstream side of the mass analyzing slit with the lens device to adjust mass resolution.

17 Claims, 9 Drawing Sheets

(51) Int. Cl.
*H01J 37/141* (2006.01)
*H01J 49/30* (2006.01)

(56) References Cited

U.S. PATENT DOCUMENTS

| | | | | |
|---|---|---|---|---|
| 2008/0135777 | A1* | 6/2008 | Yamashita | H01J 37/05 250/397 |
| 2010/0116983 | A1* | 5/2010 | Benveniste | H01J 37/3171 250/298 |
| 2010/0327178 | A1* | 12/2010 | Glavish | H01J 37/08 250/396 ML |
| 2011/0089334 | A1* | 4/2011 | McRay | H01J 37/3171 250/398 |
| 2015/0136996 | A1* | 5/2015 | Inada | H01J 37/304 250/396 R |
| 2016/0133439 | A1* | 5/2016 | Inada | H01J 37/3171 250/492.21 |
| 2016/0189912 | A1* | 6/2016 | Eisner | H01J 37/1472 250/282 |
| 2016/0189917 | A1* | 6/2016 | Vanderberg | H01J 37/3171 250/295 |

FOREIGN PATENT DOCUMENTS

| | | |
|---|---|---|
| JP | H08-212965 A | 8/1996 |
| JP | H08-315766 A | 11/1996 |
| JP | H09-245718 A | 9/1997 |
| JP | H09-251848 A | 9/1997 |

\* cited by examiner

ION IMPLANTER AND METHOD OF CONTROLLING ION IMPLANTER

RELATED APPLICATIONS

Priority is claimed to Japanese Patent Application No. 2017-225034, filed Nov. 22, 2017, the entire content of which is incorporated herein by reference.

BACKGROUND

1. Field of the Invention

The present invention relate to an ion implanter and a method of controlling the ion implanter.

2. Description of the Related Art

In an ion implanter, a mass analyzer is used to separate only a desired ion species out of ions extracted from an ion source. For example, for the suitable separation of singly charged phosphorus ions ($^{31}P^+$) having a mass number of 31 and singly charged boron fluoride ions ($^{30}(BF)^+$) having a mass number of 30, a value of about 60 or more is required as the resolution of the mass analyzer.

Since multiply charged ions having a charge state of two or more are used in ion implantation processing using high-energy ions, a mass analyzer for suitably separating multiply charged ions is required. Analysis is performed in the mass analyzer according to a mass-to-charge ratio of ions (M=m/q, m is mass and q is a charge state). Since different ion species having different charge states may have substantially the same mass-to-charge ratio in a case where the charge state q of ions is 2 or more, a required mass resolution M/dM may be 100 or more. On the other hand, in a case in which the width of a mass analyzing slit is reduced for the improvement of the resolution, there is a concern that a required beam current may not be obtained.

SUMMARY

It is desirable to provide a technique that improves the mass resolution of an ion implanter as necessary.

According to an aspect of the present invention, there is provided an ion implanter including an ion beam generating unit that includes an ion source, an extraction electrode, and a mass analyzer. The mass analyzer includes a mass analyzing magnet that applies a magnetic field to ions extracted from the ion source by the extraction electrode to deflect the ions, a mass analyzing slit that is provided downstream of the mass analyzing magnet and allows an ion of a desired ion species among the deflected ions to selectively pass, and a lens device that is provided between the mass analyzing magnet and the mass analyzing slit and applies at least one of a magnetic field and an electric field to the ion beam directed toward the mass analyzing slit to adjust the convergence or divergence of a ion beam. The mass analyzer changes a focal point of the ion beam, which passes through the mass analyzing slit, in a predetermined adjustable range between an upstream side and a downstream side of the mass analyzing slit with the lens device to adjust mass resolution.

According to another aspect of the present invention, there is provided a method of controlling an ion implanter. The ion implanter includes an ion beam generating unit that includes an ion source, an extraction electrode, and a mass analyzer. The mass analyzer includes a mass analyzing magnet that applies a magnetic field to ions extracted from the ion source by the extraction electrode to deflect the ions, a mass analyzing slit that is provided downstream of the mass analyzing magnet and allows an ion of a desired ion species among the deflected ions to selectively pass, and a lens device that is provided between the mass analyzing magnet and the mass analyzing slit and applies at least one of a magnetic field and an electric field to the ion beam directed toward the mass analyzing slit to adjust the convergence and divergence of a ion beam.

The method of controlling an ion implanter includes: calculating mass resolution of the mass analyzer which resolves the ion passing through the mass analyzing slit; and changing a focal point of the ion beam, which passes through the mass analyzing slit, in a predetermined adjustable range between an upstream side and a downstream side of the mass analyzing slit with the lens device to increase mass resolution in a case in which the calculated mass resolution is smaller than a target value.

Embodiments in which any combination of the above-mentioned components and the components or expressions of the invention are substituted between a method, a device, a system, and the like are also effective as aspects of the invention.

DETAILED DESCRIPTION

Figure 1:
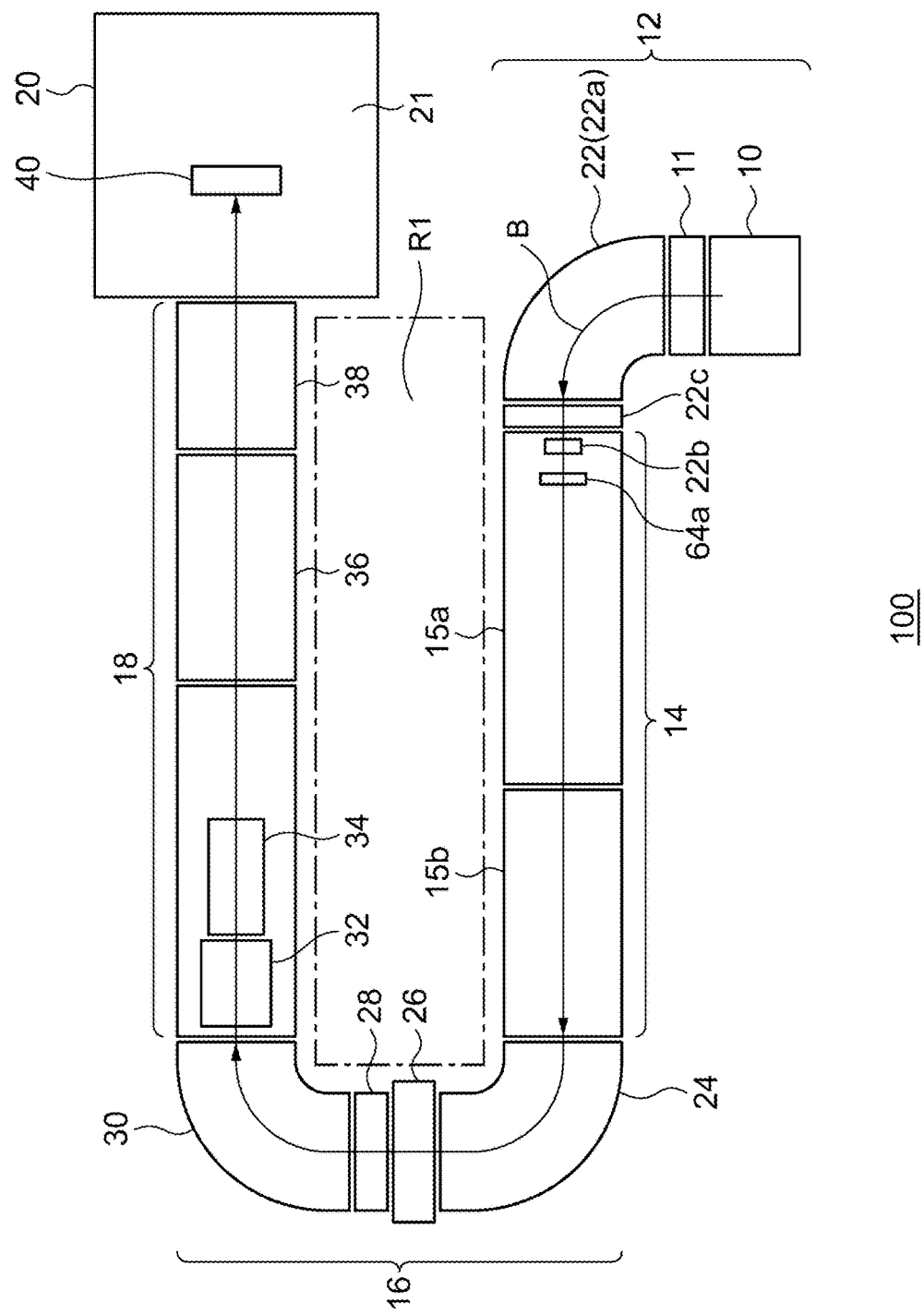
FIG. 1 is a top view schematically showing an ion implanter according to an embodiment of the invention.

An embodiment of the invention will be described in detail below with reference to the drawings. The same elements are denoted in the description of the drawings by the same reference numerals and the repeated description thereof will be appropriately omitted. Further, the structure to be described below is illustrative, and does not limit the scope of the invention.

FIG. 1 is a top view schematically showing an ion implanter 100 according to the embodiment of the invention. The ion implanter 100 is a so-called high-energy ion implanter. The high-energy ion implanter is an ion implanter that includes an ion accelerator using a radio-frequency linear acceleration system and a beamline for transporting high-energy ions. The high-energy ion implanter accelerates ions generated by an ion source 10, transports ions B, which are obtained in such way, to an object to be processed (for example, a substrate or a wafer 40) along the beamline, and implants the ions into the object to be processed.

The high-energy ion implanter 100 includes: an ion beam generating unit 12 that generates ions and performs the mass analysis of the ions; a high-energy multi-stage linear acceleration unit 14 that accelerates the ions to change the ions into high-energy ions; a beam deflection unit 16 that controls the energy analysis, trajectory adjustment, and energy dispersion of high-energy ions; a beam transport line unit 18 that transports the deflected high-energy ions to the wafer 40; and a substrate supplying/processing unit 20 that implants the transported high-energy ions into the semiconductor wafer.

The ion beam generating unit 12 includes an ion source 10, an extraction electrode 11, and a mass analyzer 22. In the ion beam generating unit 12, the ions are extracted from the ion source 10 through the extraction electrode 11 and are accelerated and the mass analysis of the extracted and accelerated ions is performed by the mass analyzer 22. The mass analyzer 22 includes a mass analyzing magnet 22a, a mass analyzing slit 22b, and a mass-analysis lens device 22c. The mass-analysis lens device 22c changes the focal point of ions to adjust the mass resolution of the mass analyzer 22. The mass analyzing slit 22b may also be disposed directly behind the mass analyzing magnet 22a, but is disposed in the entrance portion of the high-energy multi-stage linear acceleration unit 14, which is the next structure, in the embodiment. As the results of the mass analysis performed by the mass analyzer 22, only ion species required for implantation are selected and the selected ion species are guided to the next high-energy multi-stage linear acceleration unit 14.

Figure 2:
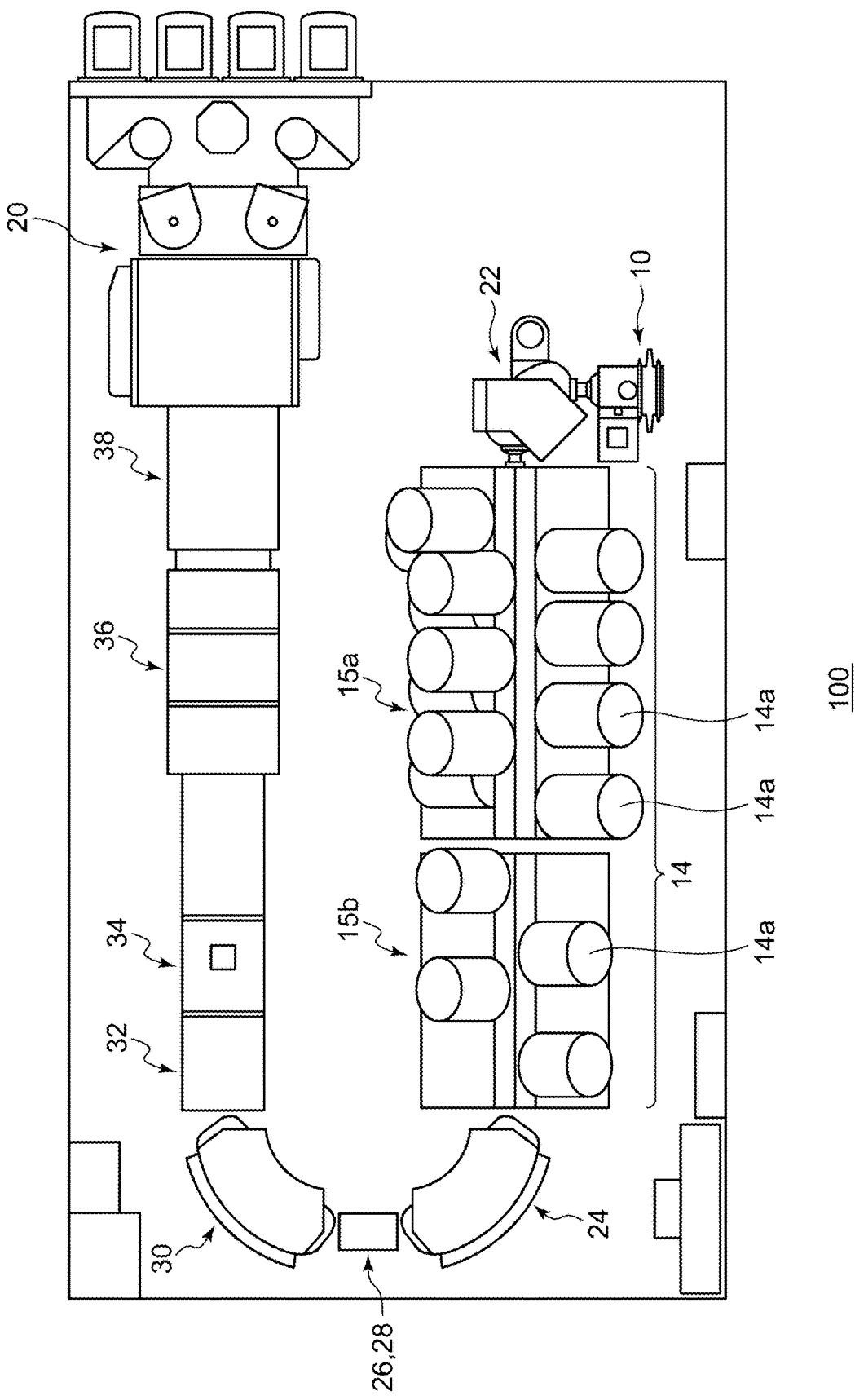
FIG. 2 is a plan view showing the entire layout including the schematic structure of a high-energy multi-stage linear acceleration unit.

FIG. 2 is a plan view showing the entire layout including the schematic structure of the high-energy multi-stage linear acceleration unit 14. The high-energy multi-stage linear acceleration unit 14 includes a plurality of linear accelerators, that is, accelerating gaps which are disposed upstream and downstream of one or more radio-frequency resonators 14a. The high-energy multi-stage linear acceleration unit 14 can accelerate ions by the action of a radio-frequency (RF) electric field.

The high-energy multi-stage linear acceleration unit 14 includes a first linear accelerator 15a that includes a basic plurality of stages of radio-frequency resonators 14a for implanting high-energy ions. The high-energy multi-stage linear acceleration unit 14 may additionally include a second linear accelerator 15b that includes an additional plurality of stages of radio-frequency resonators 14a for implanting ultra-high-energy ions. The direction of ions, which are further accelerated by the high-energy multi-stage linear acceleration unit 14, is changed by the beam deflection unit 16.

In an ion implanter using radio-frequency (RF) acceleration, the amplitude V [kV] and frequency f [Hz] of a voltage should be considered as radio-frequency parameters. Further, in a case in which a plurality of stages of radio-frequency acceleration is to be performed, the phases φ [deg] of the radio-frequency waves thereof are added as the parameters. In addition, a magnetic field lens (for example, a quadrupole electromagnet) or an electric field lens (for example, an electric field quadrupole electrode) for controlling the envelope of ion beam in a vertical direction and a horizontal direction by a focusing/defocusing effect during acceleration or after acceleration are required. Since optimum values of these operating parameters of the lens devices are changed by the energy of ions at the time when the ions pass through each the lens device and furthermore the intensity of an accelerating electric field affects the convergence/divergence of ions, the operating parameters of the lens devices are determined after the determination of the radio-frequency parameters.

Figure 3:
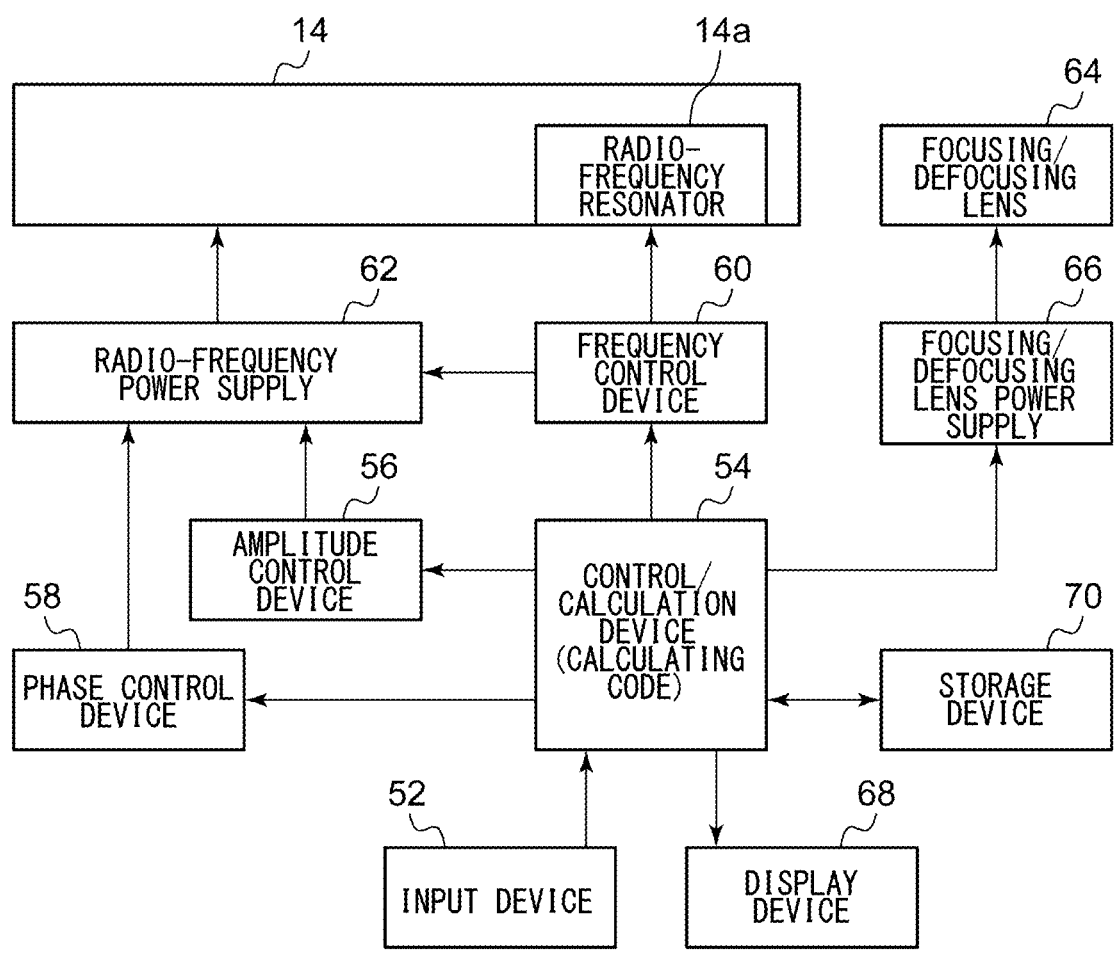
FIG. 3 is a block diagram illustrating the function and configuration of a controller for the high-energy multi-stage linear acceleration unit.

FIG. 3 is a block diagram illustrating the function and configuration of a controller 120 for the high-energy multi-stage linear acceleration unit in which accelerating electric fields (accelerating gaps) of tip ends of the plurality of radio-frequency resonators and a focusing/defocusing lenses are linearly arranged.

The high-energy multi-stage linear acceleration unit 14 includes one or more radio-frequency resonators 14a. An input device 52 that is used by an operator to input required conditions, a control/calculation device 54 that calculates the numerical values of various parameters from the input conditions and controls the respective components, an amplitude control device 56 that adjusts the amplitude of a radio-frequency voltage, a phase control device 58 that adjusts the phase of a radio-frequency wave, a frequency control device 60 that controls the frequency of a radio-frequency wave, a radio-frequency power supply 62, a focusing/defocusing lens power supply 66 for a focusing/defocusing lens 64, a display device 68 that displays the operating parameters, and a storage device 70 that stores the determined parameters are required as components that control the high-energy multi-stage linear acceleration unit 14. Further, numerical value-calculating codes (programs) for calculating the numerical values of various parameters are built in the control/calculation device 54.

In the control/calculation device 54 of a radio-frequency linear accelerator, the acceleration and convergence/divergence of ions are simulated on the basis of the input conditions by the numerical value-calculating codes built in the control/calculation device 54, and the radio-frequency parameters (the amplitude of the voltage, the frequency, and the phase) are calculated so that optimum transport efficiency is obtained. Further, the parameter (Q-coil current or a Q-electrode voltage) of the focusing/defocusing lens 64, which would efficiently transport ions, is also calculated. The calculated various parameters are displayed on the display device 68. In regard to an acceleration condition that exceeds the capability of the high-energy multi-stage linear acceleration unit 14, an indication, which means that there is no solution, is displayed on the display device 68.

A voltage amplitude parameter is sent to the amplitude control device 56 from the control/calculation device 54, and the amplitude control device 56 adjusts the amplitude of the radio-frequency power supply 62. A phase parameter is sent to the phase control device 58, and the phase control device 58 adjusts the phase of the radio-frequency power supply 62. A frequency parameter is sent to the frequency control device 60. The frequency control device 60 controls the output frequency of the radio-frequency power supply 62, and controls the resonant frequency of the radio-frequency resonators 14a arranged in the high-energy multi-stage linear acceleration unit 14. The control/calculation device 54 controls the focusing/defocusing lens power supply 66 with a calculated focusing/defocusing lens parameter.

A required number of focusing/defocusing lenses 64, which efficiently transport ions, are disposed in the radio-frequency linear accelerator and/or on the upstream and/or downstream sides of the radio-frequency linear accelerator. That is, defocusing lenses or focusing lenses are alternately provided on the upstream and/or downstream sides of the accelerating gaps of tip ends of the plurality of stages of radio-frequency resonators 14a. Further, a horizontal focusing lens and a vertical focusing lens are disposed at the end of the second linear accelerator 15b and adjust the convergence or divergence of high-energy accelerated ion beam passing through the high-energy multi-stage linear acceleration unit 14 to allow ions, which has optimum two-dimensional ion profile, to be incident into the beam deflection unit 16 provided on a subsequent stage.

As shown in FIGS. 1 and 2, the beam deflection unit 16 includes an energy analyzing electromagnet 24, a horizontally converging quadrupole lens 26 that suppresses energy dispersion, an energy analyzing slit 28, and a deflection electromagnet 30 that provides ion beam steering (trajectory correction). The energy analyzing electromagnet 24 is also called an energy filter electromagnet (EFM). The direction of high-energy ions is changed by the beam deflection unit 16, and the high-energy ions are directed to the wafer 40.

The beam transport line unit 18 is to transport ions B that pass through the beam deflection unit 16, and includes a beam shaper 32 that are composed of focusing/defocusing lens groups, a beam scanner 34, a beam parallelizer 36, and a final energy filter 38 (including final energy-separation slits). The length of the beam transport line unit 18 is designed in accordance with the total length of the ion beam generating unit 12 and the high-energy multi-stage linear acceleration unit 14, and the beam transport line unit 18 is connected to the high-energy multi-stage linear acceleration unit 14 by the beam deflection unit 16, so that a U-shaped layout is formed as a whole.

The substrate supplying/processing unit 20 is provided at the downstream end of the beam transport line unit 18. A beam monitor, an antistatic device, a wafer transport mechanism, an electro static chuck (ESC), and a wafer scanning mechanism are provided in a process chamber 21. The beam monitor measures the beam current, implantation position, implantation angle, convergence/divergence angle, vertical and horizontal ion distribution, and the like of ions B; the antistatic device prevents the wafer 40 from being electrically charged with ions B; the wafer transport mechanism carries the wafer 40 in and out to put the wafer 40 at an appropriate position and angle; the electro static chuck (ESC) holds the wafer 40 during ion implantation; and the wafer scanning mechanism moves the wafer 40 in a direction perpendicular to a beam scanning direction at a speed according to a beam current during implantation.

In this way, the beamline of the ion implanter 100 is formed as a horizontal U-shaped folded beamline that includes two long straight line portions facing each other. The upstream long straight line portion is formed of a plurality of units that accelerate ions B generated by the ion source 10. The downstream long straight line portion is formed of a plurality of units that adjust the ions B of which the direction is inverted with respect to that in the upstream long straight line portion and implant the ions B into the wafer 40. The two long straight line portions are formed so as to have substantially the same length. A work space R1, which has an area sufficient for maintenance work, is provided between the two long straight line portions.

In the high-energy ion implanter 100 in which the respective units are arranged in a U shape as described above, good workability is ensured while an increase in a foot print is suppressed. Further, since the respective units or the respective devices are formed as modules in the high-energy ion implanter 100, the respective units or the respective devices can be assembled according to the reference position of the beamline.

Further, since the high-energy multi-stage linear acceleration unit 14 and the beam transport line unit 18 are disposed so as to be folded back, an increase in the entire length of the high-energy ion implanter 100 can be suppressed. On the other hand, the high-energy multi-stage linear acceleration unit 14 and the beam transport line unit 18 are arranged substantially linear in the ion implanter in the related art. Furthermore, the radii of curvature of the plurality of electromagnets of the beam deflection unit 16 are optimized so that the width of the ion implanter is minimized. Accordingly, the foot print of the ion implanter is minimized, and work for the respective devices of the high-energy multi-stage linear acceleration unit 14 and the beam transport line unit 18 can be performed in the work space R1 provided between the high-energy multi-stage linear acceleration unit 14 and the beam transport line unit 18. Moreover, since the ion source 10 for which a maintenance interval is relatively short and the substrate supplying/processing unit 20 where substrates need to be loaded/unloaded are disposed adjacent to each other, a worker less moves.

Figure 4:
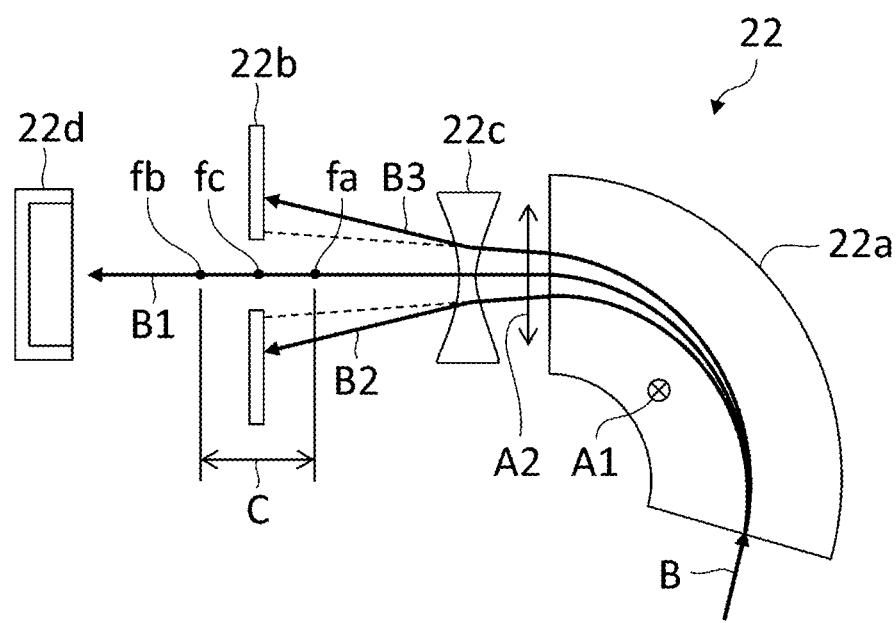
FIG. 4 is a diagram schematically showing a method of analyzing mass by a mass analyzer.

FIG. 4 is a diagram schematically showing the mass analysis of ions B performed by the mass analyzer 22. Ions B to be incident into the mass analyzing magnet 22a are deflected by the magnetic field of the mass analyzing magnet 22a, and are deflected to different paths according to the value of a mass-to-charge ratio of ions (M=m/q, m is mass and q is a charge state). In this case, the intensity of the magnetic field of the mass analyzing magnet 22a is selected so that ions B1 of ion species having a desired mass-to-charge ratio M pass through the mass analyzing slit 22b. As a result, since ions B2 and B3 of ion species, which have values (for example, M−dM or M+dM) different from the desired mass-to-charge ratio M, are blocked by the mass analyzing slit 22b, only the ion species having the desired mass-to-charge ratio M can be made to pass to the downstream side of the mass analyzer 22.

The mass analyzer 22 includes the mass-analysis lens device 22c. The mass-analysis lens device 22c adjusts the convergence or divergence of the ion beam B1, B2, and B3 exiting from the mass analyzing magnet 22a. The mass-analysis lens device 22c is disposed so as to focus or defocus ion beam in a direction (horizontal direction) A2 perpendicular to a direction (vertical direction) A1 in which the magnetic field of the mass analyzing magnet 22a is applied. The mass-analysis lens device 22c can improve the mass resolution M/dM of the mass analyzer 22, for example, by defocusing ions so that an ion trajectory shown in FIG. 4 is changed to a solid line from a dashed line.

The mass-analysis lens device 22c adjusts focusing/defocusing power about ions to change the focal point of the ions (B1), which pass through the mass analyzing slit 22b, within a predetermined adjustable range (range C). The mass-analysis lens device 22c is configured so as to change the ion beam focal point in a direction along the ion trajectory, and adjusts the ion beam focal point within the adjustable range C including, for example, a central position fc where the mass analyzing slit 22b is provided, an upstream end position fa that is present on the upstream side of the central position fc, and a downstream end position fb that is present on the downstream side of the central position fc. For example, in a case in which power for defocusing ion beam becomes higher (power for focusing ion beam becomes lower) than that set in a state in which the ion beam focal point is the central position fc, the ion beam focal point is shifted to the downstream side (a position close to the downstream end position fb). On the other hand, in a case in which power for defocusing ion beam becomes lower (power for focusing ion beam becomes higher) than that set in a state in which the ion beam focal point is the central position fc, the ion beam focal point is shifted to the upstream side (a position close to the upstream end position fa).

The mass analyzing slit 22b may be configured so that the opening width thereof is variable. For example, the mass analyzing slit 22b may be formed of two shields that can be moved in an opening width direction, and may be configured so that the opening width thereof can be adjusted by a change in a gap between the two shields. A plurality of mass analyzing slits 22b having different opening widths may be provided, and any one of the plurality of mass analyzing slits 22b may be selected to make the opening width variable. The mass resolution of the mass analyzer 22 can be adjusted by a change in the opening width of the mass analyzing slit 22b.

A Faraday cup 22d, which measures a beam current, is provided downstream of the mass analyzing slit 22b. The mass analyzer 22 acquires a mass analysis spectrum by measuring a beam current with the Faraday cup 22d while changing the intensity of the magnetic field of the mass analyzing magnet 22a. The mass analyzer 22 calculates a mass resolution from the profile of the acquired spectrum.

Figure 5:
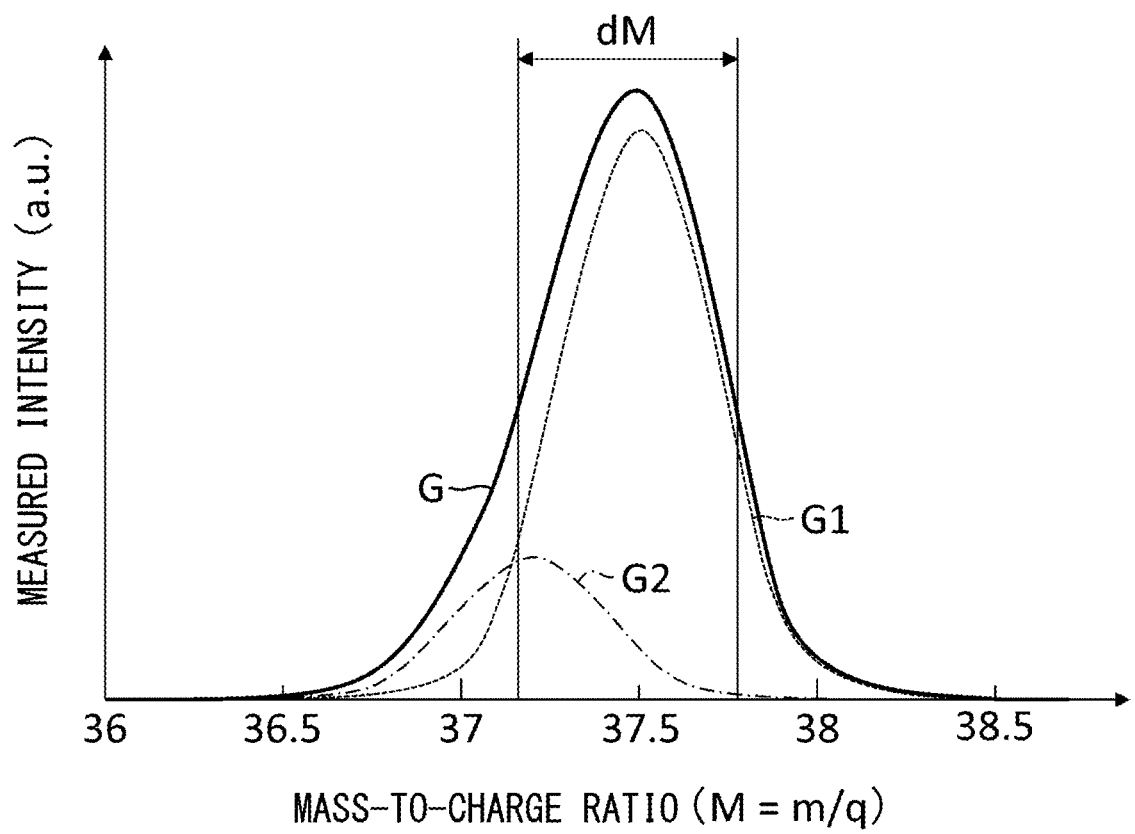
FIG. 5 is a graph showing an example of the measurement of a mass analysis spectrum.

FIG. 5 is a graph showing an example of the measurement of a mass analysis spectrum. FIG. 5 shows an example of the measurement of ions that include doubly charged arsenic ions $^{75}As^{2+}$ (having a mass-to-charge ratio of 37.5) having a mass number of 75 and quintuply charged tungsten ions $^{186}W^{5+}$ (having a mass-to-charge ratio of 37.2) having a mass number of 186. In this example, ions, which are objects to be subjected to ion implantation processing, are the arsenic ions ($^{75}As^{2+}$), and ions to be removed are the tungsten ions ($^{186}W^{5+}$). The measurement results of a mass analysis spectrum, is represented by a curve G of the graph, and the curve G includes G1 that represents the intensity distribution of the arsenic ions ($^{75}As^{2+}$) and G2 that represents the intensity distribution of the tungsten ions ($^{186}W^{5+}$) In an actual mass analysis spectrum, the intensity distribution G2 of the tungsten ions is much smaller than the intensity distribution G1 of the arsenic ions by several hundreds to several thousands or more, but the intensity distribution G2 of tungsten ions is shown to be much larger than actual intensity distribution G2 in FIG. 5 to facilitate the understanding of description.

The mass resolution M/dM of the mass analyzer 22 can be calculated by using, for example, a mass-to-charge ratio M that is obtained at the peak position of a peak profile in the mass analysis spectrum and a full width at half maximum dM that is obtained in a case in which an intensity is the half of a peak. Since the full width at half maximum dM is about 0.6 and a peak position M is about 37.5 in the example shown in FIG. 5, the mass resolution M/dM is about 62.5. Since a difference between the mass-to-charge ratio of arsenic ions ($^{75}As^{2+}$) and the mass-to-charge ratio of tungsten ion ($^{186}W^{5+}$) is 0.3, a mass resolution of 125 (M/dM=37.5/0.3=125) or more is required to suitably remove tungsten ions. Accordingly, it can be said that the mass resolution does not reach a target value in the state shown in FIG. 5.

The mass analyzer 22 has a plurality of operating modes. A first mode is a low-resolution mode in which increasing a beam current has priority, and a second mode is a high-resolution mode in which increasing a mass resolution has priority. The mass analyzer 22 switches the operating mode by adjusting the focusing/defocusing power of the mass-analysis lens device 22c, the width of the mass analyzing slit 22b, and the intensity of the magnetic field of the mass analyzing magnet 22a. The operating mode of the mass analyzer 22 is selected according to, for example, the implantation conditions of ion implantation processing.

The mass-analysis lens device 22c is operated in the first mode so that, for example, an ion beam focal point coincides with the central position fc where the mass analyzing slit 22b is provided. Further, a relatively large slit width (first slit width) is selected as the width of the mass analyzing slit 22b. The value of the mass resolution M/dM of the mass analyzer 22 in the first mode is smaller than 100, and is, for example, smaller than 75 or smaller than 50.

The intensity of the magnetic field of the mass analyzing magnet 22a is adjusted in the first mode so that the beam current of ions passing through the mass analyzing slit 22b becomes maximum. Specifically, the intensity of the magnetic field of the mass analyzing magnet 22a is adjusted so that a beam current to be measured by the Faraday cup 22d becomes maximum near a desired mass-to-charge ratio M.

The mass-analysis lens device 22c is operated in the second mode so that an ion beam focal point is positioned on the downstream side of the ion beam focal point obtained in the first mode. That is, in comparison with the first mode, the mass-analysis lens device 22c is operated so that the ions B1 passing through the mass analyzing slit 22b are defocused. Accordingly, the mass resolution M/dM in the second mode is larger than that in the first mode. The mass resolution M/dM of the mass analyzer 22 in the second mode is 100 or more, and is, for example, 125 or more.

In the second mode, a mass analysis spectrum is acquired by using the Faraday cup 22d and it is determined whether or not the mass resolution reaches a target value. In a case in which the mass resolution is smaller than the target value, for the adjustment of the mass resolution, the focusing/defocusing power of the mass-analysis lens device 22c is changed so as to allow an ion beam focal point to be further moved to the downstream side or the width of the mass analyzing slit 22b is reduced.

Figure 6:
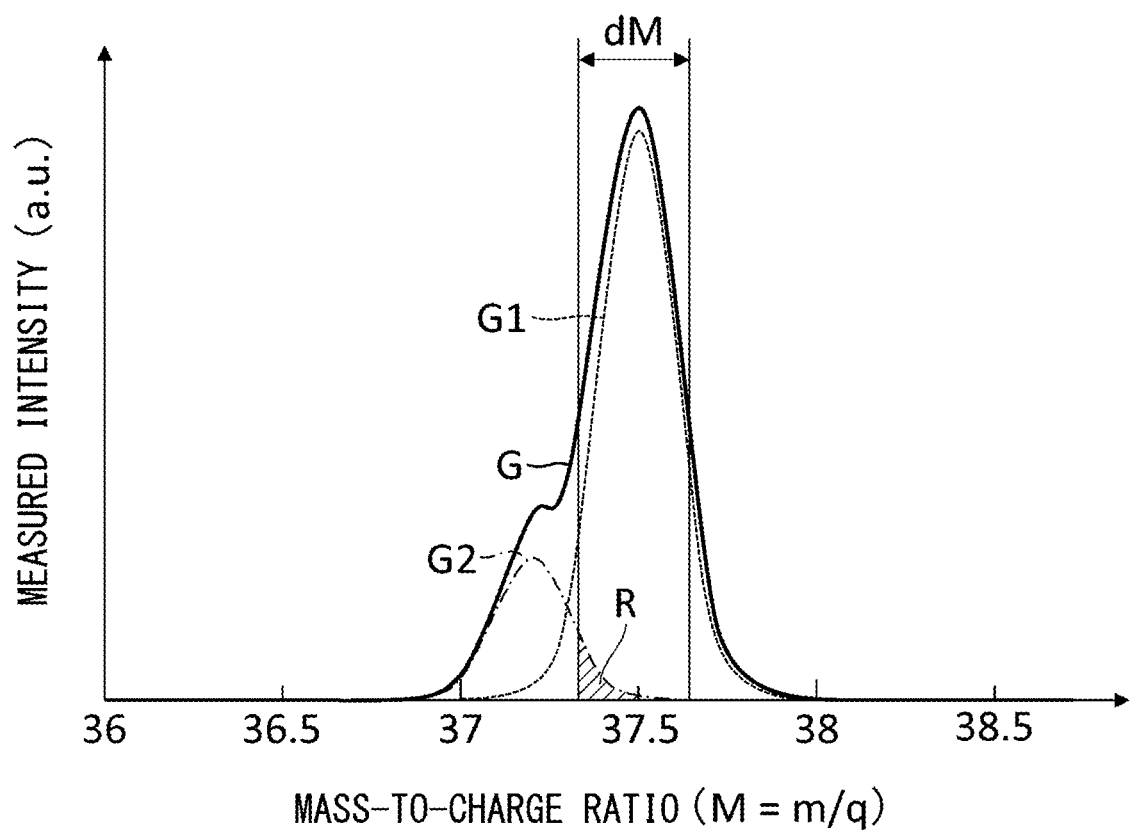
FIG. 6 is a graph showing an example of the measurement of a mass analysis spectrum.

FIG. 6 shows an example of the measurement of a mass analysis spectrum, and shows a case in which a mass resolution is increased in the second mode. Since the mass resolution of the mass analyzer 22 in FIG. 6 is higher than that in a case shown in FIG. 5, the width of the intensity distribution G1 of arsenic ions ($^{75}As^{2+}$) and the width of the intensity distribution G2 of tungsten ions ($^{186}W^{5+}$) are reduced in FIG. 6. Further, the full width at half maximum dM of a peak profile of a mass analysis spectrum G measured by the Faraday cup 22d is also reduced. Since a full width at half maximum dM is about 0.3 and the peak position M is about 37.5 in the example shown in FIG. 6, the mass resolution M/dM is about 125. Accordingly, it can be said that the target value of the mass resolution is substantially achieved in the state shown in FIG. 6.

In the example of FIG. 6, a part (a hatched region R) of the intensity distribution G2 of tungsten ions ($^{186}W^{5+}$) is included in a range dM corresponding to the opening width of the mass analyzing slit 22b. It is preferable that unnecessary ion species included in the hatched region R can be further removed in the second mode in which high resolution is required. On the other hand, in a case in which the focusing/defocusing power of the mass-analysis lens device 22c is changed so as to allow an ion beam focal point to be further moved to the downstream side or the width of the mass analyzing slit 22b is reduced to further increase a mass resolution, it may be difficult to ensure required beam current.

Figure 7:
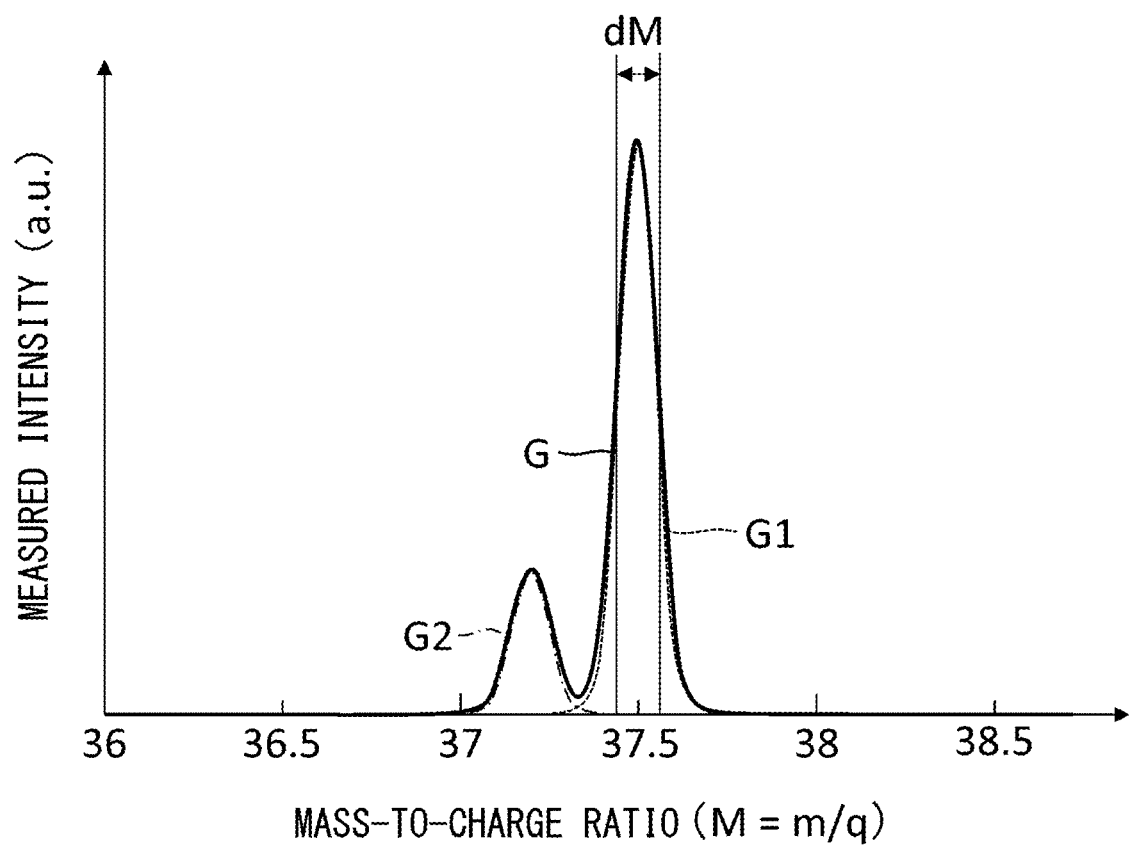
FIG. 7 is a graph showing an example of the measurement of a mass analysis spectrum.

FIG. 7 shows an example of the measurement of a mass analysis spectrum, and shows a state in which the mass resolution of the mass analyzer 22 is higher than that in a case shown in FIG. 6. Since a full width at half maximum dM is about 0.15 and a peak position M is about 37.5 in the example shown in FIG. 7, the mass resolution M/dM is about 250. As a result, the intensity distribution G2 of tungsten ions is not included in the range of the full width at half maximum dM, and arsenic ions ($^{75}As^{2+}$) and tungsten ions ($^{186}W^{5+}$) can be suitably separated from each other. However, since the full width at half maximum dM is very small, a beam current to be obtained is also small.

Accordingly, for suitable removal of unnecessary ion species, the intensity of the magnetic field of the mass analyzing magnet 22a may be adjusted in the second mode so that ions having a target mass-to-charge ratio pass through a position deviating from the center of the mass analyzing slit 22b. For example, in a case in which second ions having a second mass-to-charge ratio M2 are to be removed from first ions having a target first mass-to-charge ratio M1, the intensity of the central magnetic field of the mass analyzing magnet 22a may be set to be different from a value corresponding to the first mass-to-charge ratio M1 and to be away from a value corresponding to the second mass-to-charge ratio M2.

Figure 8:
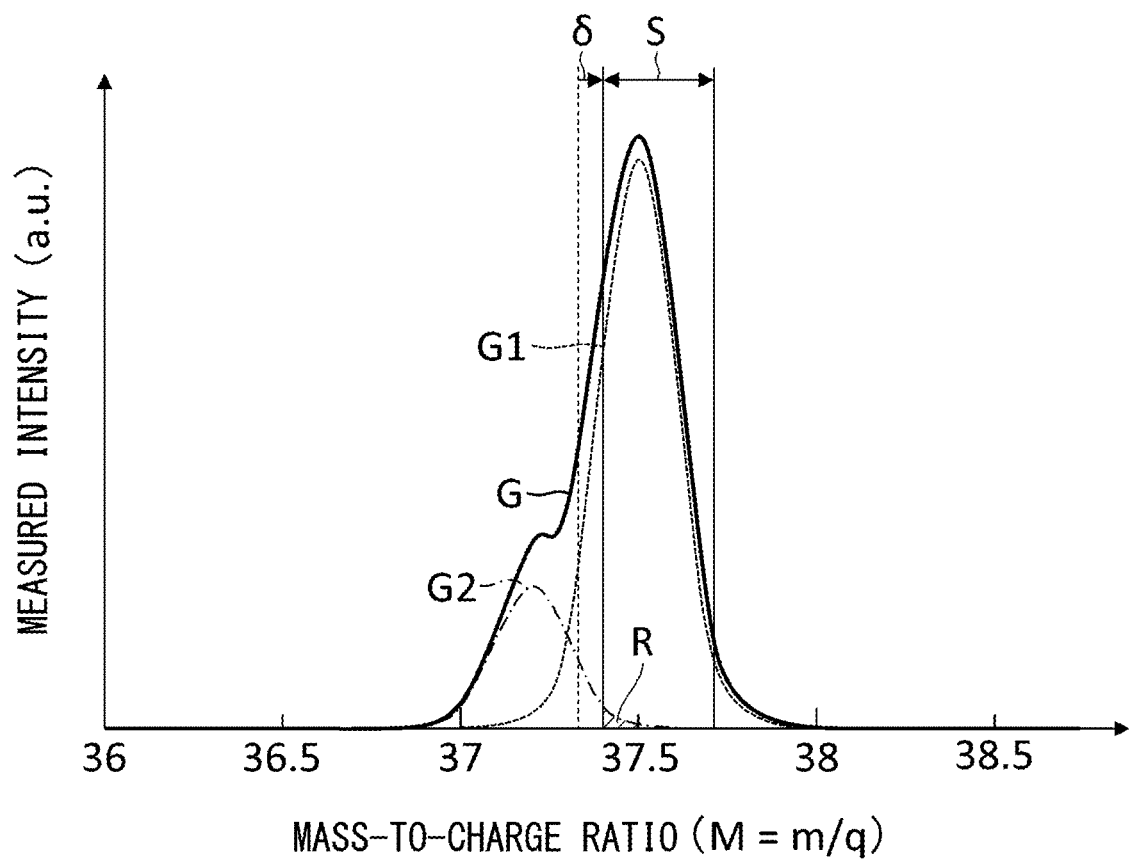
FIG. 8 is a diagram schematically showing a method of further increasing the removal rate of impurities.

FIG. 8 is a diagram schematically showing a method of further increasing the removal rate of impurities. In FIG. 8, the intensity of the central magnetic field of the mass analyzing magnet 22a is shifted to be increased in a state in which the mass analysis spectrum of FIG. 6 is obtained, and the peak of the intensity distribution G1 of arsenic ions ($^{75}As^{2+}$) is present at a position away from the center of the width S of a mass-to-charge ratio corresponding to the opening range of the mass analyzing slit 22b. That is, the intensity of the central magnetic field of the mass analyzing magnet 22a is set so that the width S of a mass-to-charge ratio corresponding to the opening range of the mass analyzing slit 22b is away from the intensity distribution G2 of tungsten ions ($^{186}W^{5+}$) to be removed. Accordingly, the amount of tungsten ions ($^{186}W^{5+}$) (hatched region R), which is included in the width S of a mass-to-charge ratio corresponding to the opening range of the mass analyzing slit 22b, is reduced, so that unnecessary ion species can be more suitably removed.

It is preferable that a difference 8 in amass-to-charge ratio corresponding to the amount of shift of the intensity of the central magnetic field, which removes impurities, is set to be smaller than 1/3 of the width S of a mass-to-charge ratio corresponding to the opening range of the mass analyzing slit 22b, and it is preferable that the difference 8 is set in the range of, for example, about 1% to 20% of the width S of a mass-to-charge ratio corresponding to the opening range. According to a specific example, a mass-to-charge ratio Mc corresponding to the intensity of the central magnetic field of the mass analyzing magnet 22a may be set so as to have a value corresponding to "$\{(k+1)M_1-M_2\}/k(k>3)$" by using the first mass-to-charge ratio M1 of first ions (for example, $^{75}As^{2+}$) as a target and the second mass-to-charge ratio M2 of second ions (for example, $^{186}W^{5+}$) to be removed.

In both the first and second modes, the intensity of the central magnetic field of the mass analyzing magnet 22a is adjusted for the optimization of the mass analyzer 22. In this case, it is preferable that an ion focal point is maintained constant so that a mass resolution is substantially not changed before and after the change of the intensity of the magnetic field of the mass analyzing magnet 22a. However, in a case in which the intensity of the central magnetic field of the mass analyzing magnet 22a is changed while operating parameters of the mass-analysis lens device 22c are maintained constant, the mass-to-charge ratio of ions passing through the mass analyzing slit 22b is changed. Accordingly, focusing/defocusing power for ions having the changed mass-to-charge ratio is changed, which leads to a shift in the ion beam focal point (that is, a change in a mass resolution). Therefore, in a case in which the intensity of the magnetic field of the mass analyzing magnet 22a is to be changed, the operating parameters of the mass-analysis lens device 22c need to be adjusted so that focusing/defocusing power for ions after the change of the intensity is equal to that before the change of the intensity.

The mass-analysis lens device 22c is formed of, for example, a magnetic field type quadrupole lens. In a case in which an ion beam is to be focused or defocused by the magnetic field type lens device, the degree of the convergence or divergence of the ion beam depends on the magnetic rigidity of ion. For example, to obtain a focusing/defocusing power having a predetermined magnitude, higher intensity of a magnetic field is required as the magnetic rigidity of ions is increased. Since the magnetic stiffness of the ions B1 passing through the mass analyzing slit 22b is proportional to the intensity of the magnetic field of the mass analyzing magnet 22a, it is possible to maintain an ion beam focal point constant by changing the intensity of the magnetic field of the mass-analysis lens device 22c in proportion to the intensity of the magnetic field of the mass analyzing magnet 22a.

The mass-analysis lens device 22c may be formed of an electric field type quadrupole lens. In a case in which an ion beam is to be focused or defocused by the electric field type lens device, the degree of the convergence or divergence of the ion beam is proportional to a ratio E/q, where E is an energy and g is a charge state of the ion. The amount of deflection by the mass analyzing magnet 22a is proportional to $(2\ mE)^{1/2}/q$, where m is a mass of the ion. Accordingly, in a case in which the intensity of the magnetic field of the mass analyzing magnet 22a is to be changed, it is possible to maintain the ion beam focal point constant by changing the intensity of the magnetic field of the mass analyzing magnet 22a so that the intensity of the magnetic field of the mass analyzing magnet 22a is proportional to $(2\ mE)^{1/2}/q$ and changing the intensity of the electric field of the mass-analysis lens device 22c so that the intensity of the electric field of the mass-analysis lens device 22c is proportional to E/q.

It is preferable that the operating parameters of the high-energy multi-stage linear acceleration unit 14 provided downstream of the mass analyzer 22 are appropriately adjusted in a case in which the ion beam focal point is to be changed with the mass-analysis lens device 22c. Specifically, it is preferable that the lens parameter of the focusing/defocusing lens (for example, the focusing/defocusing lens 64a of FIG. 1), which is provided at the inlet of the high-energy multi-stage linear acceleration unit 14, is changed to be an appropriate value according to the focal point of ion beam passing through the mass analyzing slit 22b. It is possible to more efficiently accelerate ions by appropriately setting the parameter of the focusing/defocusing lens of the high-energy multi-stage linear acceleration unit 14 according to the focal point of ion beam exiting from the mass analyzer 22.

Figure 9:
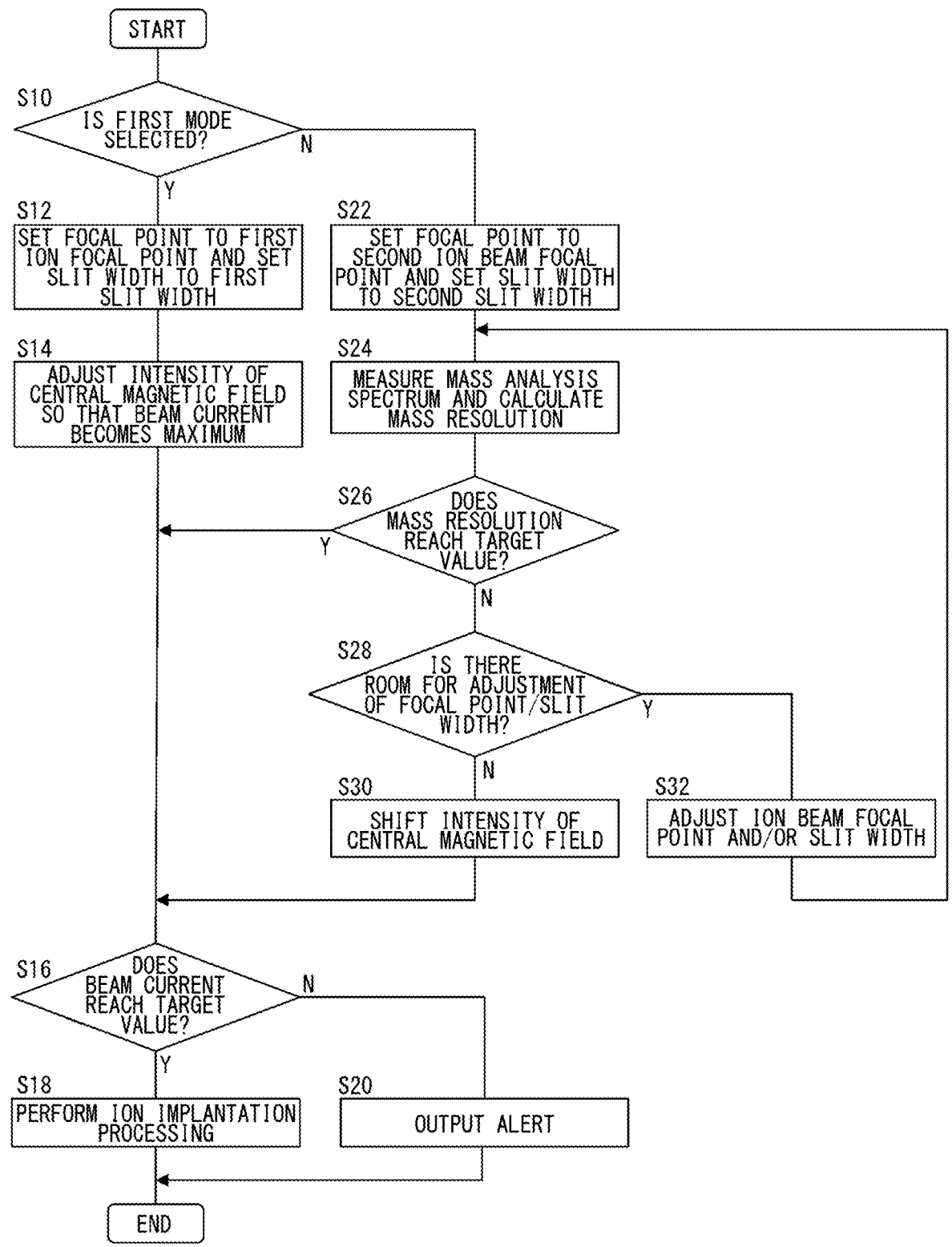
FIG. 9 is a flowchart showing an example of a method of controlling the ion implanter.

FIG. 9 is a flowchart showing an example of a method of controlling the ion implanter 100. If the first mode in which increasing a beam current has priority is selected (Yes in S10), a first slit width, which is a relatively large slit width, is set as the width of the mass analyzing slit 22b and the operating parameters of the mass-analysis lens device 22c are set so that the focal point of ion beam exiting from the mass analyzing magnet 22a is a first ion beam focal point (S12). Subsequently, the intensity of the central magnetic field of the mass analyzing magnet 22a is adjusted so that a beam current to be measured by the Faraday cup 22d becomes maximum (S14). If the beam current reaches a target value (Yes in S16), ion implantation processing for irradiating a wafer with adjusted ions is performed (S18). If the beam current does not reach the target value (No in S16), an alert indicating that the beam current is insufficient is output (S20).

If the second mode in which increasing a mass resolution has priority is selected (No in S10), a second slit width, which is a relatively small slit width, is set as the width of the mass analyzing slit 22b and the operating parameters of the mass-analysis lens device 22c are set so that the ion beam focal point is a second ion beam focal point positioned on the downstream side of the first ion beam focal point (S22). Subsequently, the mass analysis spectrum is measured using the Faraday cup 22d and the mass resolution M/dM is calculated (S24). If the mass resolution reaches a target value (Yes in S26) and the beam current reaches the target value (Yes in S16), ion implantation processing for irradiating a wafer with adjusted ions is performed (S18). If the beam current does not reach the target value (No in S16), an alert indicating that the beam current is insufficient is output (S20).

If the mass resolution does not reach the target value (No in S26) and there is a room for the adjustment of the ion beam focal point and/or the slit width (Yes in S28), the ion beam focal point is shifted to the downstream side and/or adjustment for reducing the slit width is performed (S32) and a mass resolution is calculated again (S24). On the other hand, if there is no room for the adjustment of the ion beam focal point and the slit width (No in S28), the intensity of the central magnetic field of the mass analyzing magnet 22a is shifted to increase the removal rate of ions to be removed (S30). If the beam current reaches the target value (Yes in S16) in a state in which the intensity of the central magnetic field is shifted, ion implantation processing for irradiating a wafer with adjusted ions is performed (S18). If the beam current does not reach the target value (No in S16), an alert indicating that the beam current is insufficient is output (S20).

In a case in which the intensity of the magnetic field of the mass analyzing magnet 22a is to be changed in the processing of S14 and S30, it is preferable that the focusing/defocusing power of the mass-analysis lens device 22c is adjusted so that a change in the focal point of ion beam passing through the mass analyzing slit 22b is suppressed before and after the change of the intensity of the magnetic field of the mass analyzing magnet 22a.

According to this embodiment, it is possible to improve a mass resolution by defocusing the ion beam with the mass-analysis lens device 22c so that the focal point of ions exiting from the mass analyzing magnet 22a is positioned on the relatively downstream side. Further, by shifting the intensity of the central magnetic field of the mass analyzing magnet 22a, impurities can be more effectively removed even though impurities having a mass-to-charge ratio close to the target ions are included in the ions. Even in a case in which a difference between the mass-to-charge ratio of first ions as a target and the mass-to-charge ratio of second ions to be removed has a small value (for example, 0.5 or less) since ions of a plurality of species having different charge states are included, impurities can be effectively removed.

Therefore, according to this embodiment, the quality of ion implantation processing can be improved since more highly pure ions are provided.

The invention has been described above on the basis of the embodiment. Since the invention can include various design changes without being limited to the embodiment, it is understood by those skilled in the art that the invention can have various modification examples and the modification examples are also included in the scope of the invention.

A case in which the mass analyzer 22 has a plurality of operating modes has been described in the above-mentioned embodiment, but the mass analyzer 22 may be operated only in a second mode in a modification example.

A case in which the first ion beam focal point, which is obtained in the first mode in which increasing a beam current has a priority, coincides with the position of the mass analyzing slit 22b and the second ion beam focal point, which is obtained in the second mode in which increasing a mass resolution has a priority, is positioned on the downstream side of the mass analyzing slit 22b has been described in the above-mentioned embodiment. In a modification example, the first ion beam focal point may be set on the downstream side of the mass analyzing slit 22b and the second ion beam focal point may be set on a further downstream side of the first ion beam focal point. Moreover, the first ion beam focal point may be set on the upstream side of the mass analyzing slit 22b. In this case, the second ion beam focal point may be set to coincide with the position of the mass analyzing slit 22b, and may be set on the upstream side or the downstream side of the mass analyzing slit 22b.

A case in which a high mass resolution is achieved by the comprehensive adjustment of the focusing/defocusing power of the mass-analysis lens device 22c, the width of the mass analyzing slit 22b, and the intensity of the magnetic field of the mass analyzing magnet 22a has been described in the above-mentioned embodiment. In a modification example, a high mass resolution may be achieved by the adjustment of some of these. For example, a mass resolution may be adjusted using only a change in the ion beam focal point, which is performed by the mass-analysis lens device 22c, without a change in the width of the mass analyzing slit 22b.

In the above-mentioned embodiment, the high-energy ion implanter including the linear acceleration unit has been described by way of example. However, the method of adjusting a mass resolution according to this embodiment can also be applied to an ion implanter that does not include a linear acceleration unit.

It should be understood that the invention is not limited to the above-described embodiment, but may be modified into various forms on the basis of the spirit of the invention. Additionally, the modifications are included in the scope of the invention.

What is claimed is:

1. An ion implanter comprising:
   an ion beam generating unit that includes an ion source, an extraction electrode, and a mass analyzer,
   wherein the mass analyzer includes
      a mass analyzing magnet that applies a magnetic field to ions extracted from the ion source by the extraction electrode to deflect the ions,
      a mass analyzing slit that is provided downstream of the mass analyzing magnet and allows an ion of a desired ion species among the deflected ions to selectively pass, and
      a lens device that is provided between the mass analyzing magnet and the mass analyzing slit and applies a magnetic field to the ion beam directed toward the mass analyzing slit to adjust a convergence or divergence of the ion beam, and an intensity of the magnetic field applied to the ion beam passing through the lens device is proportional to an intensity of the magnetic field applied to the ion beam passing through the mass analyzing magnet.

2. The ion implanter according to claim 1,
wherein the mass analyzer defocuses the ion, which passes through the mass analyzing slit, with the lens device so that the focal point of the ion beam is present on a downstream side of the mass analyzing slit, to increase mass resolution to be higher than that obtained in a case in which the focal point of the ion beam passing through the mass analyzing slit coincides with the position of the mass analyzing slit.

3. The ion implanter according to claim 1,
wherein the mass analyzer is capable of adjusting a mass resolution M/dM based on a mass-to-charge ratio M=m/q which is a ratio of a mass m of an ion to the charge q of the ion so that the mass resolution M/dM is 100 or more.

4. The ion implanter according to claim 3,
wherein in the mass analyzer, a target ion is a doubly charged arsenic ion $^{75}As^{2+}$ having a mass number of 75, an ion to be removed is a quintuply charged tungsten ion $^{186}W^{5+}$ having a mass number of 186, and the mass resolution M/dM is capable of being adjusted to be 125 or more.

5. The ion implanter according to claim 1,
wherein an ion having a target mass-to-charge ratio passes through a center of the mass analyzing slit.

6. The ion implanter according to claim 1,
wherein an ion having a target mass-to-charge ratio passes through a position away from a center of the mass analyzing slit.

7. The ion implanter according to claim 1,
wherein the mass analyzer has a first mode in which increasing a beam current of the ion passing through the mass analyzing slit has priority and a second mode in which increasing a mass resolution of the mass analyzer which resolves the ion passing through the mass analyzing slit has priority, and a focal point of the ion beam passing through the mass analyzing slit in the second mode is present on a downstream side of the focal point of the ion beam passing through the mass analyzing slit in the first mode.

8. The ion implanter according to claim 7,
wherein the mass analyzing slit is adapted so that an opening width of the mass analyzing slit is variable, and
the opening width of the mass analyzing slit in the second mode is smaller than that in the first mode.

9. The ion implanter according to claim 8,
wherein the mass analyzer includes a plurality of mass analyzing slits having different opening widths, and selects any one of the plurality of mass analyzing slits to adjust the opening width.

10. The ion implanter according to claim 8,
wherein the mass analyzing slit is formed by two shields that are movable in an opening width direction, and changes a gap between the two shields to adjust the opening width.

11. An ion implanter comprising:
an ion beam generating unit that includes an ion source, an extraction electrode, and a mass analyzer, wherein the mass analyzer includes
a mass analyzing magnet that applies a magnetic field to ions extracted from the ion source by the extraction electrode to deflect the ions,
a mass analyzing slit that is provided downstream of the mass analyzing magnet and allows an ion of a desired ion species among the deflected ions to selectively pass, and
a lens device that is provided between the mass analyzing magnet and the mass analyzing slit and applies a magnetic field to the ion beam directed toward the mass analyzing slit to adjust the convergence or divergence of a ion beam, and an intensity of the magnetic field applied to the ion beam passing through the mass analyzing magnet is proportional to $(2mE)^{1/2}/q$, and an intensity applied to the ion beam passing through the lens device is proportional to $E/q$, where E is an energy, m is a mass, and q is a charge of a target ion.

12. A method of controlling an ion implanter including an ion beam generating unit that includes an ion source, an extraction electrode, and a mass analyzer, wherein the mass analyzer includes
a mass analyzing magnet that applies a magnetic field to ions extracted from the ion source by the extraction electrode to deflect the ions,
a mass analyzing slit that is provided downstream of the mass analyzing magnet and allows an ion of a desired ion species among the deflected ions to selectively pass, and
a lens device that is provided between the mass analyzing magnet and the mass analyzing slit and applies at least one of a magnetic field and an electric field to the ion beam directed toward the mass analyzing slit to adjust a convergence or divergence of the ion beam, and the method comprises
calculating mass resolution of the mass analyzer which resolves the ion passing through the mass analyzing slit, and
changing a focal point of the ion beam, which passes through the mass analyzing slit, in a predetermined adjustable range between an upstream side and a downstream side of the mass analyzing slit with the lens device to increase mass resolution in a case in which the calculated mass resolution is smaller than a target value.

13. The method of controlling an ion implanter according to claim 12,
wherein in a case in which the calculated mass resolution is smaller than the target value, the ion, which passes through the mass analyzing slit, is defocused with the lens device so that the focal point of the ion beam is present on a downstream side of the mass analyzing slit, to increase the mass resolution of the mass analyzer which resolves the ion passing through the mass analyzing slit.

14. The method of controlling an ion implanter according to claim 12, further comprising:
reducing an opening width of the mass analyzing slit in a case in which the calculated mass resolution is smaller than the target value.

15. The method of controlling an ion implanter according to claim 12, further comprising:
adjusting an intensity of the magnetic field applied to the ion beam passing through the mass analyzing magnet so that an ion having a target mass-to-charge ratio passes through a position away from a center of the mass analyzing slit, in a case in which the calculated mass resolution is smaller than the target value.

16. The method of controlling an ion implanter according to claim 12, further comprising:
adjusting focusing/defocusing power of the lens device so that a change in the focal point, which is caused by a change in an intensity of the magnetic field applied to the ion beam passing through the mass analyzing magnet, of the ion passing through the mass analyzing slit is reduced.

17. The method of controlling an ion implanter according to claim 12,
wherein the ion implanter further includes a multi-stage linear acceleration unit that is provided downstream of the ion beam generating unit,
the multi-stage linear acceleration unit includes a plurality of stages of radio-frequency resonators that are adapted to accelerate an ion exiting from the mass analyzer, and a focusing/defocusing lens that is disposed at an inlet of the plurality of stages of radio-frequency resonators, and
the method further comprises setting a lens parameter according to a focal point of the ion beam passing through the mass analyzing slit.

* * * * *